United States Patent
Hsu et al.

[11] Patent Number: 6,057,579
[45] Date of Patent: May 2, 2000

[54] TRANSISTOR STRUCTURE OF ESD PROTECTION DEVICE

[75] Inventors: Chen-Chung Hsu, Hsinchu Hsien; Tien-Hao Tang, Taipei Hsien, both of Taiwan

[73] Assignee: United Microelectronics Corp., Hsinchu, Taiwan

[21] Appl. No.: 09/307,319

[22] Filed: May 7, 1999

[51] Int. Cl.[7] .................................................. H01L 23/62
[52] U.S. Cl. ........................... 257/360; 257/401; 257/546
[58] Field of Search .................................... 257/255, 360, 257/546, 356, 357, 401

[56] References Cited

U.S. PATENT DOCUMENTS 5,714,785  2/1998  Jiang ........................................ 257/360

FOREIGN PATENT DOCUMENTS 3-73569   3/1991  Japan ....................................... 257/355
4-10473   1/1992  Japan ....................................... 257/355
4-132253  5/1992  Japan ....................................... 257/355

*Primary Examiner*—Donald L. Monin, Jr.
*Attorney, Agent, or Firm*—Hickman Stephens Coleman & Hughes, LLP

[57] ABSTRACT

A transistor structure for an ESD protection device, which includes a gate structure constituted by a connecting part and a plurality of protecting parts on a substrate. The protecting parts include a first protecting part and a second protecting part, wherein the first protecting part is located closer to the middle of the gate structure and the second protecting part is located further from the middle of the gate structure. The width of the second protecting part is larger than that of the first protecting part. There are sources and drains alternated with the protecting parts, wherein the sources include a first isolated from the drain by the first protecting part and a second source isolated from the drain by the second protecting part. The substrate junction is connected to the second source with a butting face and a butting contact is located above the butting face to connect the second source and the substrate junction simultaneously.

12 Claims, 3 Drawing Sheets

— 6,057,579 —

TRANSISTOR STRUCTURE OF ESD PROTECTION DEVICE

BACKGROUND OF THE INVENTION

1. Field of Invention

The present invention relates to a structure for an electrostatic discharge (ESD) protection device. More particularly, the invention relates to a transistor structure having a different gate width.

2. Description of Related Art

In production of an integrated circuit, such as dynamic random access memory (DRAM) and static random access memory (SRAM), or after the manufacture of a wafer, damage caused by current leakage in the integrated circuit is often a result of an ESD occurring outside the integrated circuit. In the most common complementary metal oxide semiconductor (CMOS)technology, the ESD occurring outside the wafer causes severe damage to the wafer. Therefore, an ESD protection circuit is usually fabricated in the integrated circuit to direct the current to a ground before the current from the ESD enters an internal circuit. This prevents the damage caused by current entering the internal circuit.

To prevent the damaging effect of the ESD to the wafer, many types of software and hardware to restrain ESD have been developed. Conventionally, the most common method is to restrain the ESD with hardware, i.e. to design an ESD protection circuit between the internal circuit and each bonding pad to protect its internal circuit. As shown in FIG. 1, the design of the ESD protection circuit mainly connects an NMOS transistor between the bonding pad and the internal circuit and connects the NMOS transistor to the ground. Alternatively, a PMOS transistor is connected and this PMOS transistor is connected to a power line. As a result, when the current from the ESD is input via the bonding pad, the NMOS transistor and the PMOS transistor are turned on, and the current from the ESD is directed to the ground instead of the internal circuit.

FIG. 2 is a diagram showing the perspective view of a conventional transistor structure for an ESD protection device is provided. A gate structure 200 includes projecting parts 202 and a connecting part 204. The projecting parts 202 are parallel and isolated from each other by a distance, while the connecting part 204 which is located at one side of the gate structure 200, connects to the projecting parts 202. There are sources 208 and 208a as well as drains 206 alternating between projecting parts 202. The sources include a first source 208 located in the middle of the gate structure 200 and a second source 208a located further from the middle of the gate structure 200. There are contacts 212 in a row on each first source 208 and each drain 206, which connect the first source 208 and the drain 206 to the external circuit (not shown), respectively. In addition, a substrate junction 214 is connected to the second source 208a with a butting face and butting contacts 218 are formed in a row on the butting face.

FIG. 3 is across-sectional diagram illustrating the transistor structure along a 3—3 intersecting line in FIG. 2. It is understood from FIG. 3 that the projecting parts 202 are formed with a gate oxide layer 203 located below for electrical isolation and the butting contact 218 simultaneously connects to the second source 208a and the substrate junction 214. The butting contact 218 is used to reduce the resistivity between the second source 208a and the substrate junction 214. This prevents a latch-up effect due to the oversized resistivity between the second source 108a and the substrate junction 214.

When a current from the ESD reaches the drain 206 via the contact 212 of the drain 206, the current can pass through a channel 220 controlled by each projecting part 202 to reach the first source 208 or the second source 208a. It can be directed to a ground (not shown) via the contact 212 or directed to a substrate 210 via the substrate junction 214 in order to achieve a grounding effect.

As the butting contact 218 is simultaneously in contact with the second source 208a and the substrate junction 214, the resistivity between the second source 108a and the substrate 214 is rather small. Although the latch-up effect will not happen with a smaller resistivity, most of the current moves in the direction with less resistance, for example, to the substrate junction 214, after the current from the ESD reaches the drain 206 via the contact 212. In this case, the current that flows through the region adjacent to the butting contact 218 may become too large and a punch through can easily happen. The ESD protection device, which is located adjacent to the butting contact, is thus more prone to damage.

SUMMARY OF THE INVENTION

Therefore, the present invention provides a structure of an ESD protection device, so that the current from the ESD can be directed in a more even fashion to the ground after it reaches the drain via the contact. This prevents most current to be directed via the substrate junction and thus no damage in the region adjacent to the butting contact will occur.

In the invention, the structure of the ESD protection device includes a gate structure constituted by a connecting part and protecting parts. These protecting parts are parallel and isolated from each other by a distance, while the connecting part located at one side of the gate structure is connecting these projecting parts. The protecting parts further comprise of a first protecting part located closer to the middle of the gate structure and a second protecting part located further from the middle of the gate structure. However, the width of the second projecting part is larger than that of the first protecting part. There are sources and drains alternated between the protecting parts in the substrate, wherein the sources include a first source isolated from the drain by the first protection and a second source isolated from the drain by the second protection. There are a plurality of contacts connecting the first source and the drain to the circuit outside the transistor. In addition, there is a substrate junction that connects to the second source with a butting face. The butting contact is located on the butting face and connects simultaneously to the outer source and the substrate junction, so that the resistivity between the outer source and the substrate junction is reduced.

The advantage of the invention is that it has a second protecting part wider than the first protecting part. The channel length controlled by the second projecting part is therefore longer than the channel length controlled by the first protecting part. A longer channel length is thus formed as a result of a larger resistivity. The current from the ESD flows in an even fashion to the first protecting part and the second protecting part due to the approximately similar resistivities at both sides, after it reaches the drain via the contact. This prevents the punch through and the subsequent damage in the region adjacent to the butting contact due to a lowered resistivity between the second source and the substrate junction as well as a flow of oversized current to the substrate junction.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
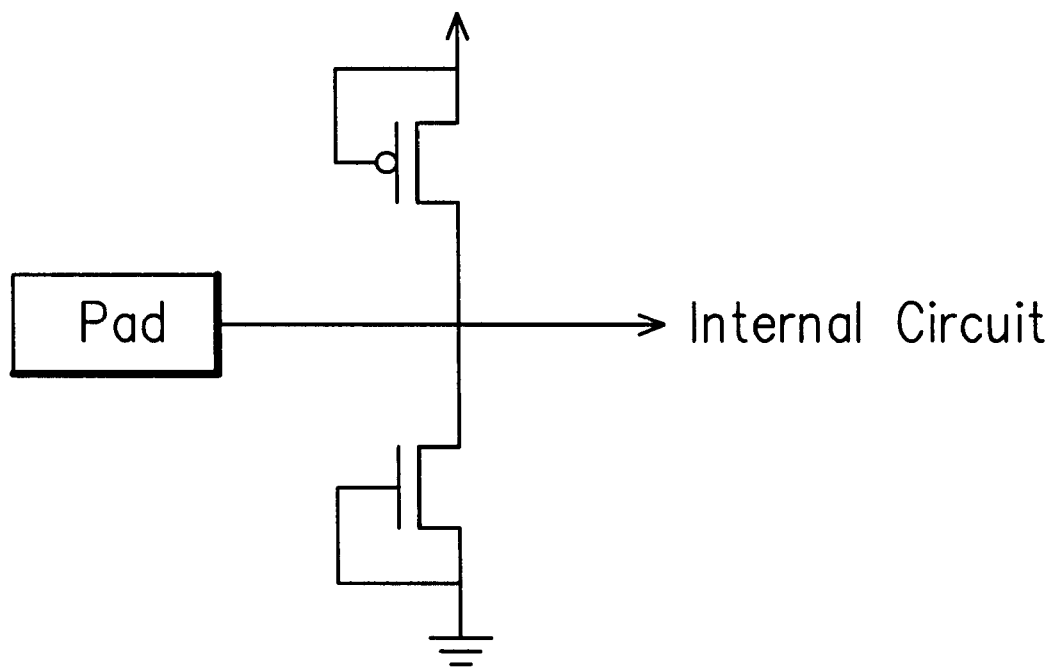
FIG. 1 is a circuit diagram showing the design of the ESD protection circuit.
Figure 2:
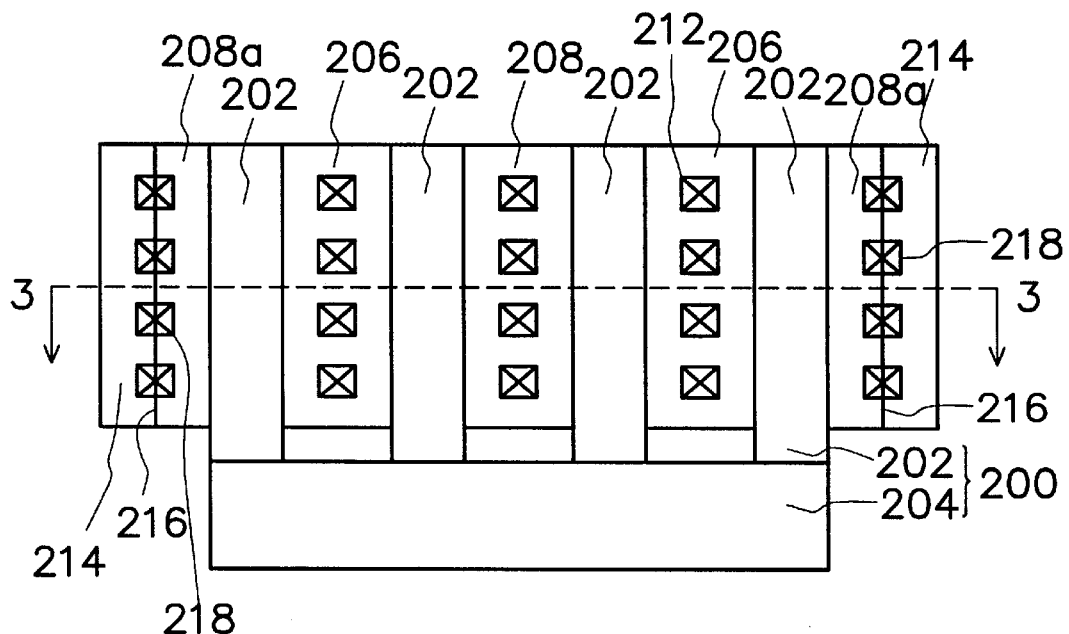
FIG. 2 is a diagram showing the perspective view of a conventional transistor structure in the ESD protection circuit.
Figure 3:
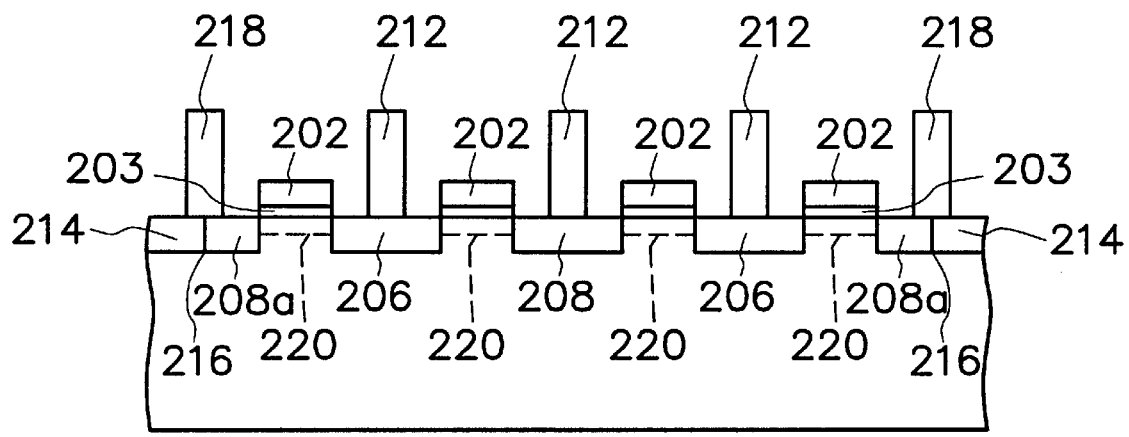
FIG. 3 is a cross-sectional diagram showing the transistor structure of the ESD protection device in FIG. 2 along 3—3 intersecting line.

Reference will now be made in detail to the present preferred embodiments of the invention, examples of which are illustrated in the accompanying drawings. Wherever possible, the same reference numbers are used in the drawings and the description to refer to the same or like parts.

Figure 4:
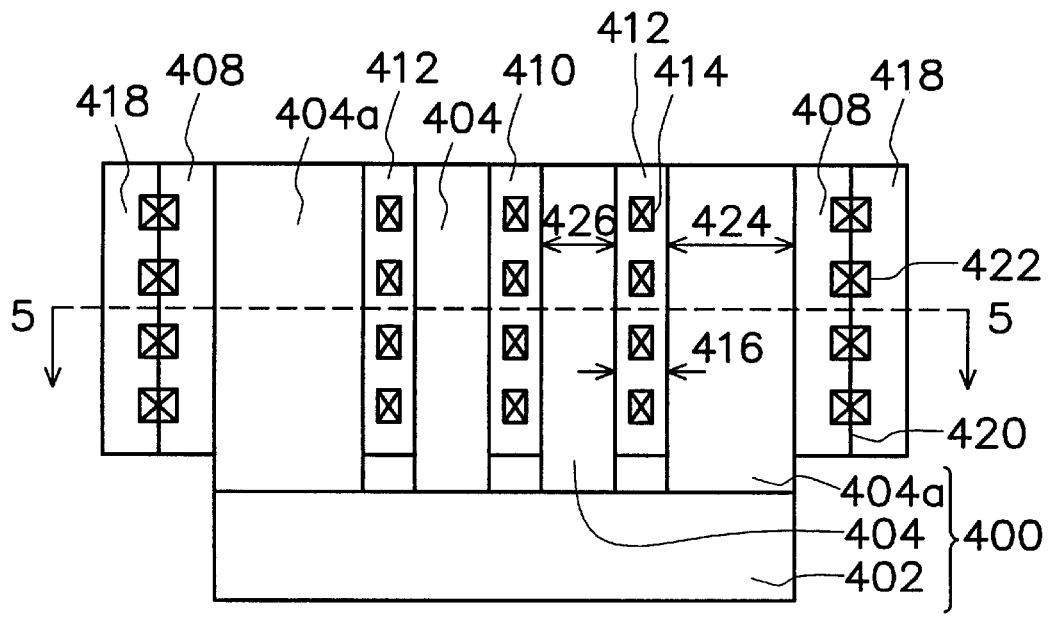
FIG. 4 is a diagram showing the perspective view of a conventional transistor structure in the ESD protection circuit, according to a preferred embodiment.

FIG. 4 is a diagram showing the perspective view of a transistor structure of the ESD protection device, according to a preferred embodiment. In FIG. 4, a gate structure 400 comprises a connecting part 402, protecting parts 404, 404a. The protecting parts 404, 404a are formed with a gate oxide layer 403 (shown in FIG. 5) located below for electrical isolation. The protecting parts further comprise of a first protecting part 404 located close to the middle of the gate structure 400 and a second protecting part 404a located farther from the middle of the gate structure 400. The first protecting art 404 and the second protecting part 404a are parallel and isolated from each other by a distance. The connecting part 402, which is located at one side of the gate structure 400, is connecting to the first protecting part 404 and the second projecting part 404a at the same side of the gate structure 400. The second protecting part 404a has a width 424 that is larger than a width 426 of the first protecting part and the width 424 is preferably twice the width 426. There are a first source 410, a second source 408 and a drain 412, which aligned in a consecutive manner with the protecting parts. The first source 410 is isolated from the drain 412 by the first protecting part 404 while the second source 408 is isolated from the drain 412 by the second protecting part 404a. There are contacts 414 located above the source 410 and the drain 412, wherein the contact 414 is approximately located in the middle of the width 416 of each source and each drain. This indicates that the distance from the contact 414 on the first source to that on the drain 412 at left side is approximately similar to the distance from the contact 414 on the first source to that on the drain 412 at right side. In addition, there is a substrate junction 418 closely connecting to the second source 408. A butting face 420 is formed between the substrate junction 418 and the second source 408, wherein butting contacts 422 are formed in a row on the butting face 420.

Figure 5:
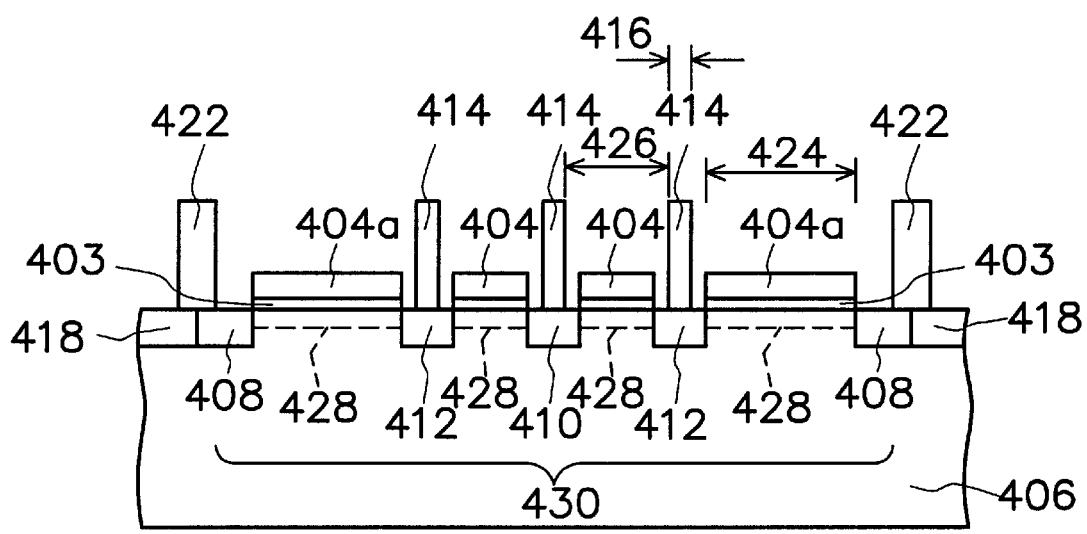
FIG. 5 is a cross-sectional diagram showing the transistor structure of the ESD protection device in FIG. 4 along 5—5 intersecting line.

FIG. 5 is a cross-sectional diagram showing the transistor structure of the ESD protection device in FIG. 4 along a 5—5 intersecting line. For a clear description of the preferred embodiment, the same reference numerals used in FIG. 4 refer to the same devices. The substrate 406, the gate structure 400, the first source 410, the drain 412, and the second source 408 together constitute a transistor 430. The first source 410, the drain 412, and the second source 408 in this case are high concentration doped regions that have a different conductive type from the substrate 306. The substrate junction 418 in this case is the high concentration doped region that has a conductive type similar to the substrate 406. The butting contact 422 connects simultaneously to the second source 408 and the substrate junction 418. This reduces the resistance between second source 408 and the substrate junction 418 in order to prevent the latch-up effect.

In the above structure, the second protecting part is wider than the first protecting part. The channel controlled by the second protecting part is longer than that controlled by the first protecting part. Since a longer channel is disadvantageous for current passage and results a slower conduction rate, more current will be moving sideways to the first protecting part without butting contacts, after the current from the ESD reaches the drain of the transistor. This resolves the problem where a hugh amount of the current accumulates and moves to the substrate junction. As the current from the ESD reaches the drain, it is directed in an even fashion to the ground. The problem where a huge amount of the current accumulates around the butting contact is thus resolved, effectively preventing the punch-through. This further prevents the damage to the ESD protection device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A transistor structure of an ESD protection device, comprising:
   a substrate;
   a gate structure located above the substrate with a plurality of protecting parts and a connecting part located on one side of the gate structure to connect each of the protecting parts, wherein:
   the protecting parts further comprise of a first protecting part and a second protecting part that is wider than the first protecting part, wherein the first protecting part is located in the middle of the gate structure and the second protecting part is located farther from the middle of the gate structure compared to the first protecting part;
   a plurality of sources and drains alternating with the protecting parts in the substrate, wherein the sources further comprise of a first source isolated from the drain by the first protecting part and a second source isolated from the drain by the second protecting part;
   a substrate junction located in the substrate and in contact with the second source with a butting face; and
   a butting contact located above the butting face wherein the butting contact connects to the second source and the substrate junction.

2. The transistor structure of claim 1, wherein the transistor structure further includes a plurality of contacts connecting in a row to the top of the sources and drains.

3. The transistor structure of claim 2, wherein the position of the connection is in the middle of the width of the source or the drain.

4. The transistor structure of claim 1, wherein the width of the second protecting part is twice the width of the protecting parts.

5. The transistor structure of claim 1, wherein the first source, the drain, and the second source include a high concentration doped region having a different conductive type from the substrate.

6. The transistor structure of claim 1, wherein the substrate junction includes a high concentration doped region, which has a similar conductive type to the substrate.

7. A transistor structure of an ESD protection device, comprising:

a substrate;

a gate structure located above the substrate with a plurality of protecting parts and a connecting part located on one side of the gate structure to connect all the protecting parts, wherein:

the protecting parts further comprise of first protecting parts and second protecting parts, with the first protecting parts located closer to the middle of the gate structure and the second protecting parts located further from the middle of the gate structure;

a plurality of sources and drains alternating with the protecting parts in the substrate, wherein the sources include a first source isolated form the drain by the first protecting part and two second sources isolated form the drains by the second protecting parts;

two substrate junctions located in the substrate, wherein each substrate junction connects to each second source with a butting face; and a plurality of butting contacts located above the butting faces, wherein the butting contacts connect to the second sources and the substrate junctions.

8. The transistor structure of claim 7, wherein he transistor structure further includes a plurality of contacts connecting to the top of the sources and drains.

9. The transistor structure of claim 8, wherein the position of the connection is in the middle of the width of the source or the drain.

10. The transistor structure of claim 7, wherein the second protecting part is twice as wide as the first protecting part.

11. The transistor structure of claim 7, wherein the first source, the drain, and the second source include a high concentration doped region having a different conductive type from the substrate.

12. The transistor structure of claim 7, wherein the substrate junction includes a high concentration doped region, which has a similar conductive type to the substrate.

* * * * *